United States Patent
Li et al.

(10) Patent No.: US 12,166,116 B2
(45) Date of Patent: Dec. 10, 2024

(54) SEMICONDUCTOR DEVICE AND FABRICATION METHOD THEREOF

(71) Applicant: INNOSCIENCE (SUZHOU) TECHNOLOGY CO., LTD., Suzhou (CN)

(72) Inventors: Hao Li, Suzhou (CN); King Yuen Wong, Suzhou (CN); Weigang Yao, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 549 days.

(21) Appl. No.: 17/427,923

(22) PCT Filed: Feb. 25, 2021

(86) PCT No.: PCT/CN2021/077853
§ 371 (c)(1),
(2) Date: Aug. 3, 2021

(87) PCT Pub. No.: WO2022/178750
PCT Pub. Date: Sep. 1, 2022

(65) Prior Publication Data
US 2022/0376101 A1    Nov. 24, 2022

(51) Int. Cl.
*H01L 29/778* (2006.01)
*H01L 29/20* (2006.01)
(Continued)

(52) U.S. Cl.
CPC ...... *H01L 29/7786* (2013.01); *H01L 29/2003* (2013.01); *H01L 29/41725* (2013.01); *H01L 29/42316* (2013.01)

(58) Field of Classification Search
CPC ............ H01L 29/7786; H01L 29/2003; H01L 29/41725; H01L 29/42316; H01L 29/0649;
(Continued)

(56) References Cited

U.S. PATENT DOCUMENTS 9,911,843 B2 * 3/2018 Umeda ............. H01L 29/42316
2009/0162981 A1  6/2009 Yin et al.
(Continued)

FOREIGN PATENT DOCUMENTS

CN       1630099 A      6/2005
CN     101325221 A     12/2008
(Continued)

OTHER PUBLICATIONS

International Search Report and Written Opinion of the corresponding PCT application No. PCT/CN2021/077853 mailed on Nov. 11, 2021.
(Continued)

*Primary Examiner* — Natalia A Gondarenko
(74) *Attorney, Agent, or Firm* — JCIPRNET

(57) ABSTRACT

A semiconductor device includes a drain electrode, a first source electrode, a second source electrode, a first gate electrode, and a second gate electrode. The first gate electrode is arranged between the first source electrode and the drain electrode. The first gate electrode extends along a first direction. The second gate electrode is arranged between the second source electrode and the drain electrode. The second gate electrode extends along the first direction. The first gate electrode is arranged above a first imaginary line substantially perpendicular to the first direction in a top view of the semiconductor device and the second gate electrode is
(Continued)

arranged below a second imaginary line substantially perpendicular to the first direction in the top view of the semiconductor device.

20 Claims, 15 Drawing Sheets

(51) Int. Cl.
*H01L 29/417* (2006.01)
*H01L 29/423* (2006.01)

(58) Field of Classification Search
CPC .......... H01L 29/0642; H01L 29/66462; H01L 29/41758; H01L 29/122–127; H01L 29/15–158; H01L 29/6656; H01L 29/66431; H01L 29/6653; H01L 29/66719; H01L 29/778–7789; H01L 29/7816; H01L 29/808; H01L 29/404; H01L 29/205; H01L 29/207; H01L 29/227; H01L 29/32; H01L 29/7787; H01L 21/2654; H01L 21/266; H01L 21/3003; H01L 21/3006; H01L 21/3245; H01L 21/42; H01L 21/423; H01L 21/425; H01L 21/426; H01L 23/28; H01L 23/3171; H01L 23/3192; H01L 21/02183; H01L 21/02164; H01L 21/0228; H01L 21/02274; H01L 21/02107; H01L 21/02112; H01L 21/022; H01L 21/02208; H01L 21/02205; H01L 2924/13064; H01L 21/02225; H01L 21/0229; H01L 21/2123; H01L 21/0217; H01L 21/28114; H01L 21/823468; H01L 21/823864; H01L 21/823456; H01L 21/82385

USPC ... 257/76, 77, 183, 190, 194, 192, 631, 615; 438/327, 172, 445, 515, 471
See application file for complete search history.

(56) References Cited

U.S. PATENT DOCUMENTS

| | | |
|---|---|---|
| 2009/0309139 A1 | 12/2009 | Bryant et al. |
| 2014/0231874 A1* | 8/2014 | Hoshi ............... H01L 21/76224 257/194 |
| 2014/0264449 A1* | 9/2014 | Parsey, Jr. ........... H01L 29/7787 257/194 |
| 2016/0043208 A1* | 2/2016 | Ikoshi ................ H01L 29/0619 257/192 |
| 2017/0200823 A1 | 7/2017 | Kang et al. |
| 2018/0102426 A1 | 4/2018 | Ikoshi et al. |
| 2018/0374943 A1 | 12/2018 | Liu et al. |
| 2019/0109222 A1 | 4/2019 | Liu et al. |
| 2019/0139776 A1 | 5/2019 | Kudymov et al. |
| 2019/0319023 A1* | 10/2019 | Ranta ..................... H01L 21/86 |

FOREIGN PATENT DOCUMENTS

| | | |
|---|---|---|
| CN | 107731889 A | 2/2018 |
| CN | 107768439 A | 3/2018 |
| CN | 108493250 A | 9/2018 |
| KR | 20180072942 A | 7/2018 |

OTHER PUBLICATIONS

First Office Action of the corresponding China patent application No. 202180000619.0 mailed on Jul. 14, 2022.

* cited by examiner

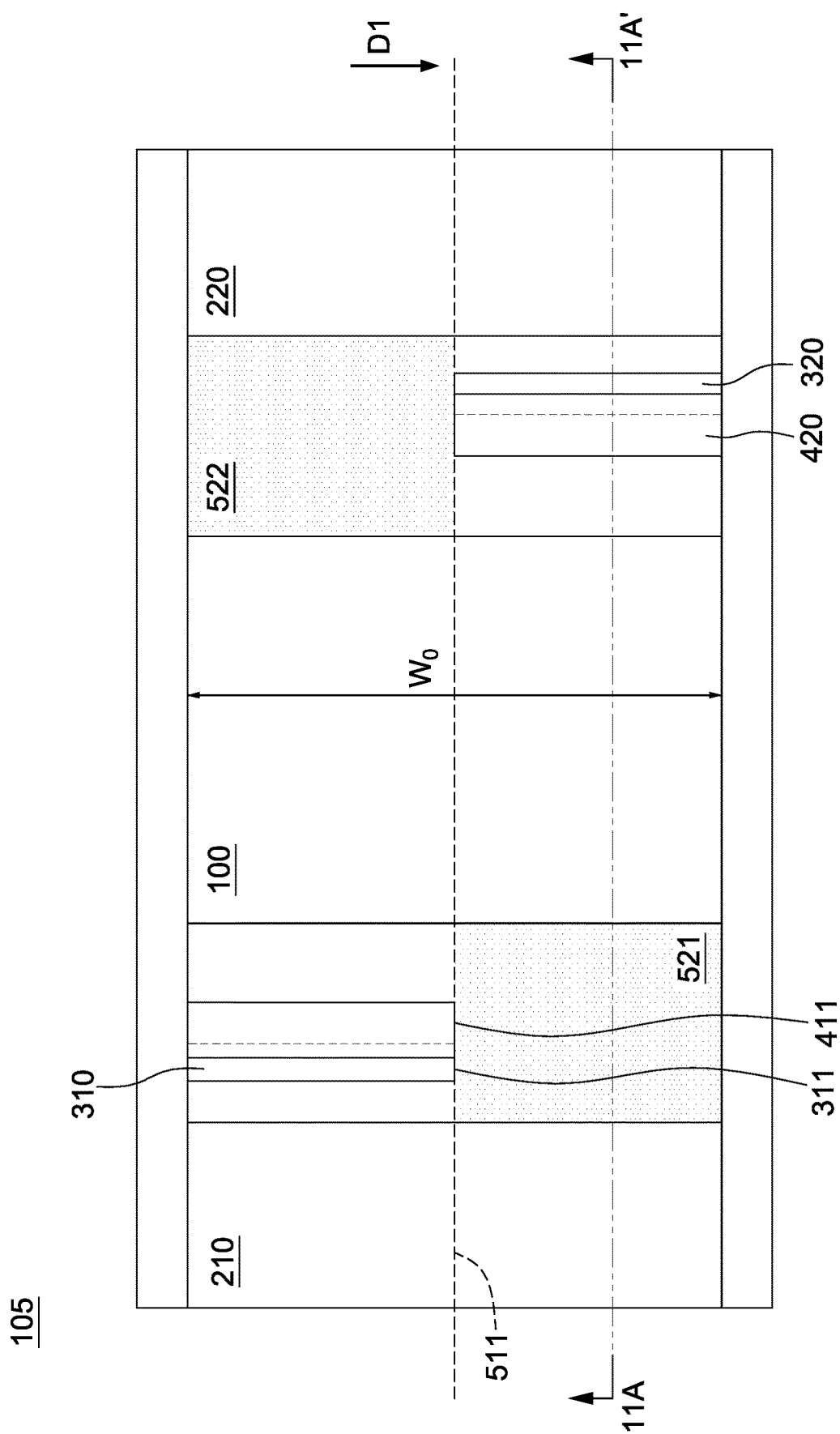

SEMICONDUCTOR DEVICE AND FABRICATION METHOD THEREOF

BACKGROUND

1. Technical Field

The present disclosure relates to a semiconductor device and a fabrication method thereof.

2. Description of the Related Art

Components including direct bandgap semiconductors, for example, semiconductor components including group III-V materials or group III-V compounds (Category: III-V compounds) can operate or work under a variety of conditions or in a variety of environments (e.g., at different voltages and frequencies) due to their characteristics.

The semiconductor components may include a heterojunction bipolar transistor (HBT), a heterojunction field effect transistor (HFET), a high-electron-mobility transistor (HEMT), a modulation-doped FET (MODFET) and the like.

SUMMARY OF THE INVENTION

High power RF power devices need proper layout for thermal management. Due to high power density, device will be heated to very high temperature during operation. The reproduced heat will seriously degenerate device performance, such as output power and efficiency.

One objective of this disclosure aims to solve problem of thermal dissipation of high power devices. This disclosure provides some concepts to solve the problem, such as removing partial of 2DEG area in active region, remove partial of gate electrodes and field plates over the 2DEG, and etc.

In some embodiments of the present disclosure, a semiconductor device is provided, which includes a drain electrode, a first source electrode, a second source electrode, a first gate electrode, and a second gate electrode. The first source electrode is arranged on a first side of the drain electrode. The second source electrode is arranged on a second side of the drain electrode, opposite to the first source electrode. The first gate electrode is arranged between the first source electrode and the drain electrode. The first gate electrode extends along a first direction. The second gate electrode is arranged between the second source electrode and the drain electrode. The second gate electrode extends along the first direction. The first gate electrode is arranged above a first imaginary line substantially perpendicular to the first direction in a top view of the semiconductor device and the second gate electrode is arranged below a second imaginary line substantially perpendicular to the first direction in the top view of the semiconductor device.

In some embodiment of the present disclosure, a semiconductor device is provided, which includes a III-nitride heterogeneous semiconductor stack, a drain electrode, a first source electrode and a second source electrode. The III-nitride heterogeneous semiconductor stack includes a first nitride layer and a second nitride layer having a bandgap greater than that of the first nitride layer. The drain electrode is arranged on the III-nitride heterogeneous semiconductor stack having a drain length along a first direction. The first source electrode is arranged on a first side of the drain electrode. The second source electrode is arranged on a second side of the drain electrode, opposite to the first source electrode. A first non-active region is in the III-nitride heterogeneous semiconductor stack between the first source electrode and the drain electrode, and a second non-active region is in the III-nitride heterogeneous semiconductor stack between the second source electrode and the drain electrode. Lengths of the first non-active region and the second non-active region are shorter than the drain length and the first non-active region and the second non-active region are asymmetrically arranged with respect to the drain electrode.

In some embodiments of the present disclosure, a method for manufacturing a semiconductor device is provided. The method includes forming a III-nitride heterogeneous semiconductor stack, forming a first non-active region and a second non-active region in the III-nitride heterogeneous semiconductor layer, and forming a first non-active region and a second non-active region in the III-nitride heterogeneous semiconductor layer. The first non-active region and the second non-active region are asymmetrically arranged with respect to the drain electrode.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 9, FIG. 10A, FIG. 10B, FIG. 11A and FIG. 11B illustrate several operations in manufacturing a semiconductor device according to some embodiments of the present disclosure

PREFERRED EMBODIMENT OF THE PRESENT INVENTION

Figure 1A:
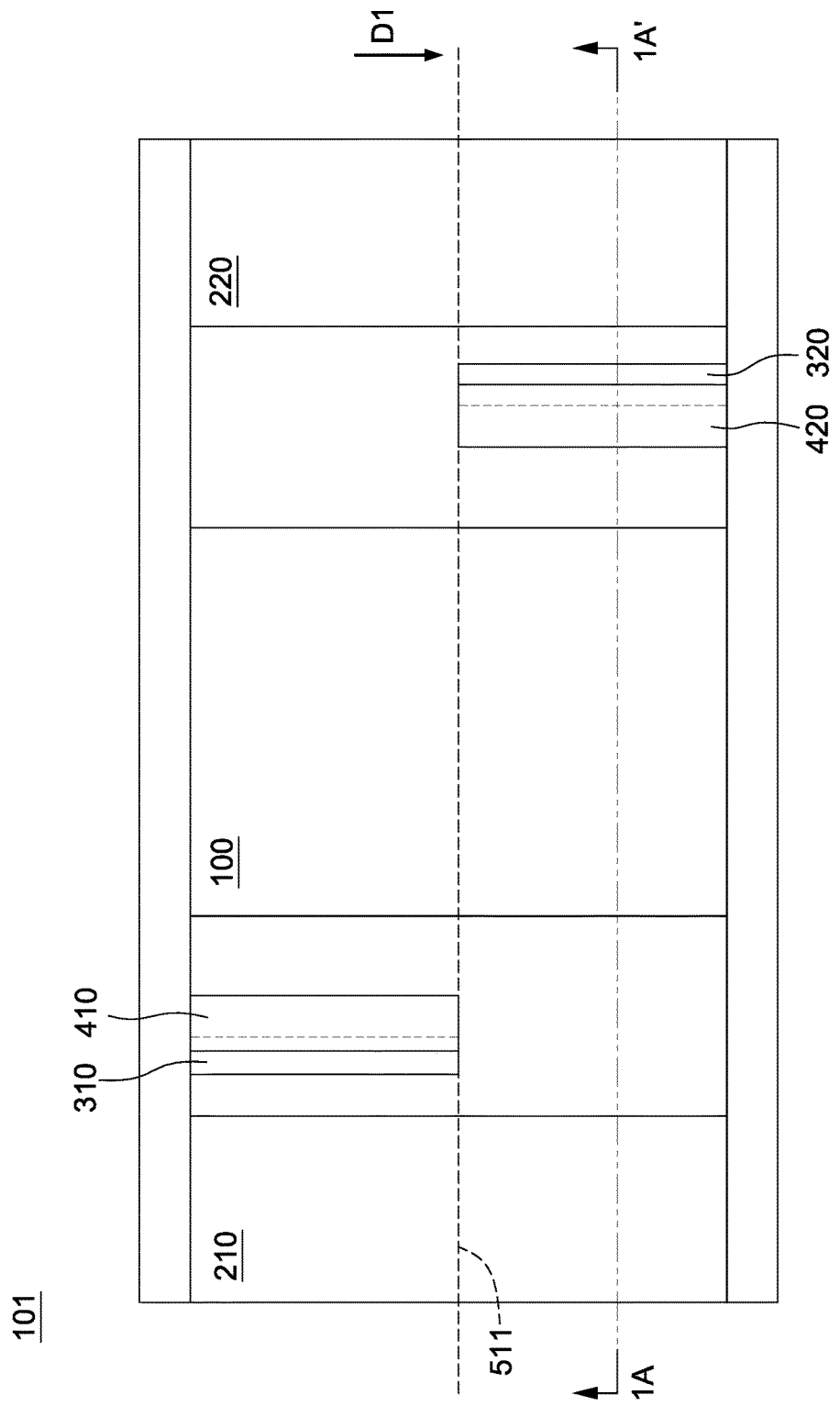
FIG. 1A is a top view of a semiconductor device according to some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A is a top view of a semiconductor device 101 according to some embodiments of the present disclosure. The semiconductor device 101 may be adopted in an RF device, such as a power RF device, but the present disclosure is not limited thereto. The semiconductor device 101 can work at high power (e.g. equal to or greater than 3 W. The semiconductor device 101 can work at relatively great or high voltage level (e.g. greater than 600 V) to function as a high voltage transistor. The semiconductor device 101 can work at relatively great or high frequency (e.g. greater than 6 GHz).

The semiconductor device 101 may include a drain electrode 100, a source electrode 210, a source electrode 220, a gate electrode 310 and a gate electrode 320.

The source electrode 210 is arranged on one side of the drain electrode 100. The gate electrode 310 is arrange on the same side of the drain electrode 100. The gate electrode is arranged between the source electrode 210 and the drain electrode 100. The gate electrode may extend along a direction D1.

The source electrode 220 is arranged on another side of the drain electrode 100 opposite to the source electrode 210. The gate electrode 320 is arranged between the source electrode 220 and the drain electrode 100. The gate electrode 320 may extend along the direction D1.

The semiconductor device 101 has an imaginary line 511 which is substantially perpendicular to the direction D1 in a top view of the semiconductor device 101.

The gate electrode 310 may be arranged above the imaginary line 511 in a top view of the semiconductor device 101. The gate electrode 320 may be arranged below the imaginary line 512 in the top view of the semiconductor device 101. The gate electrode 310 and the gate electrode 320 may be asymmetrically arranged with respect to the drain electrode 100.

The semiconductor device 101 may be operated at high power. The asymmetrically arranged gate electrodes 310, 320 may result in asymmetric current distribution. Such asymmetric arrangement reduces a ratio of thermal producing area in a total area of the semiconductor device 10, and heat may be rapidly dissipated. The thermal dissipation ability of the semiconductor device 101 can be satisfactory due to the relatively dissipation area, and thus the overall performance of the semiconductor device 101 can be improved.

Figure 1B:
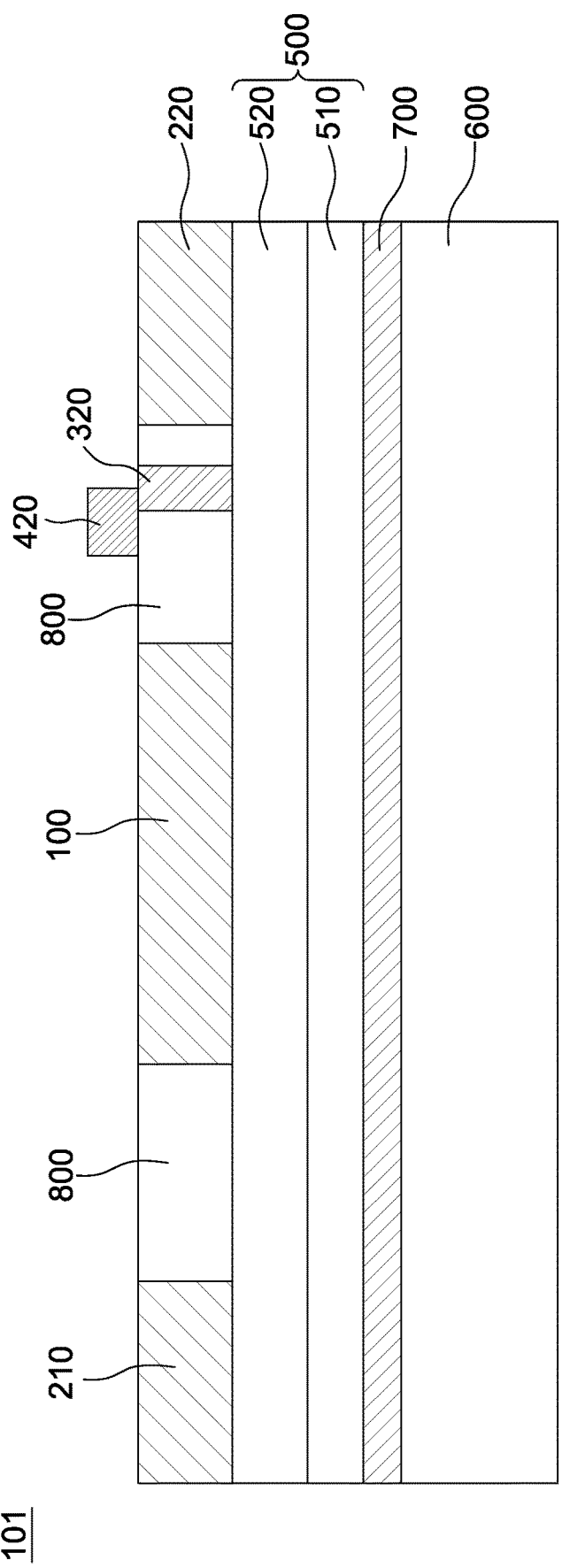
FIG. 1B is a cross-section view of the semiconductor device of FIG. 1A according to some embodiments of the present disclosure.

FIG. 1B is a cross-section view of semiconductor device 10 of FIG. 1A along line 1A-1A'. The semiconductor device 10 may further include III-nitride heterogeneous semiconductor stack 500. The III-nitride heterogeneous semiconductor stack 500 may include nitride layer 510 and nitride layer 520. The nitride layer 520 may have a bandgap greater than that of the nitride layer 510.

The nitride layer 510 may include, without limitation, a group III nitride, for example, a compound $In_xAl_yGa_{1-x-y}N$, in which x+y≤1. The group III nitride may further include, but is not limited to, for example, a compound $Al_yGa_{(1-y)}N$, in which y≤1. For example, the nitride layer 510 may include a GaN layer having a bandgap of about 3.4 eV.

The nitride layer 520 may be formed on the nitride layer 510. The nitride layer 520 may have a greater bandgap than that of the nitride layer 510. The nitride layer 520 may be in direct contact with the nitride layer 510. The nitride layer 520 may include, without limitation, a group III nitride, for example, a compound $In_xAl_yGa_{1-x-y}N$, in which x+y≤1. The group III nitride may further include, but is not limited to, for example, a compound $Al_yGa_{(1-y)}N$, in which y≤1. For example, the nitride layer 520 may include AlGaN having a band gap of about 4 eV.

A heterojunction may be formed between the nitride layer 510 and the nitride layer 520, e.g., at an interface of the nitride layer 510 and the nitride layer 520, and the polarization of the heterojunction of different nitrides forms a two-dimensional electron gas (2DEG) region adjacent to the interface of the nitride layer 510 and the nitride layer 520. The 2DEG region may be formed in the nitride layer 510. The nitride layer 510 can provide electrons to or remove electrons from the 2DEG region, thereby controlling the conduction of the semiconductor device 10.

The drain electrode 100, the source electrode 210, the source electrode 220, the gate electrode 310 and the gate electrode 320 may be arranged on the III-nitride heterogeneous semiconductor stack 500.

The semiconductor device 101 may further include a substrate 600. The substrate 600 may include, without limitation, silicon (Si), doped Si, silicon carbide (SiC), germanium silicide (SiGe), gallium arsenide (GaAs), sapphire, silicon on insulator (SOI), or other suitable material(s). The substrate 600 may further include a doped region, for example, a p-well, an n-well, or the like. The substrate 600 may include impurity. The substrate 600 may include a p-type silicon substrate.

The semiconductor device 101 may further include a buffer layer 700. The buffer layer 700 is disposed between the substrate 600 and the III-nitride heterogeneous semiconductor stack 500. The buffer layer 700 may be a super lattice layer to facilitate operation of the semiconductor device 10 in a relatively high voltage level. The buffer layer 700 may be configured to reduce defects due to the dislocation between the substrate 600 and the subsequently formed III-nitride heterogeneous semiconductor stack 500. The buffer layer 700 may include, but is not limited to, nitride, such as AlN, AlGaN or the like.

The gate electrode 310 and gate electrode 320 may be disposed over the III-nitride heterogeneous semiconductor stack 500. The gate electrode 310 and gate electrode 320 may include a conductive layer. The gate electrode 310 and gate electrode 320 may be or include a gate metal. The gate metal may include, for example, but is not limited to, titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials.

The semiconductor device 101 may further include field plates 410, 420. The field plate 410 may be disposed adjacent to the gate electrode 310. The field plate 420 may be disposed adjacent to the gate electrode 320. The field plate 410 may be partially above the gate electrode 310. The field plate 410 may be partially above the dielectric layer 800. The field plate 420 may be partially above the gate electrode 320. The field plate 420 may be partially above the dielectric layer 800. The field plates 410, 420 can include a conductive material. The field plates 410, 420 can be at zero potential. The field plate potential diminishes the influence of the drain voltage on the depletion region width and electric field build-up. With field plates, high breakdown voltages can be achieved for large drain extension region, and the influence of interface traps can be largely mitigated.

Figure 2A:
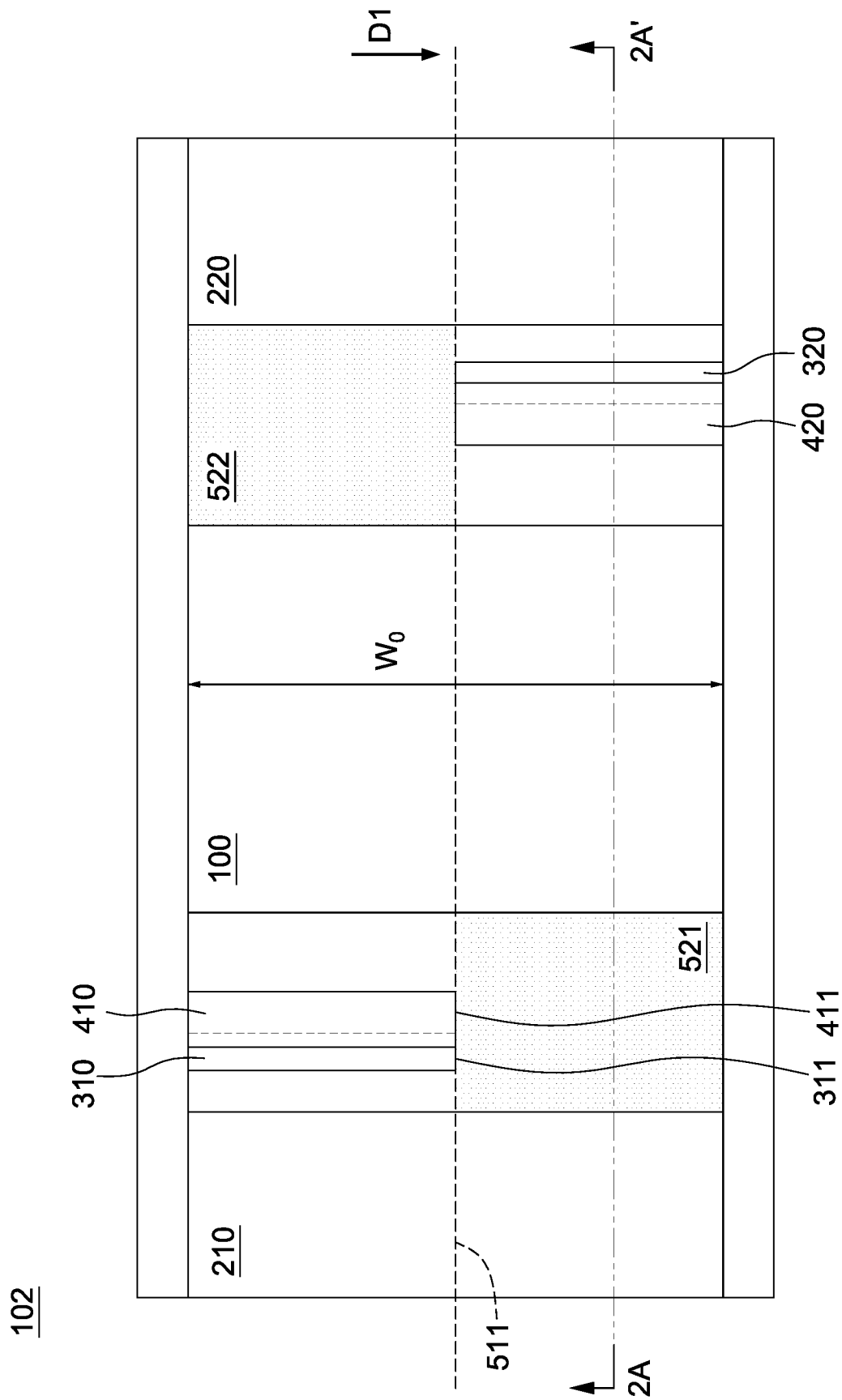
FIG. 2A is a top view of a semiconductor device according to some embodiments of the present disclosure.
Figure 2B:
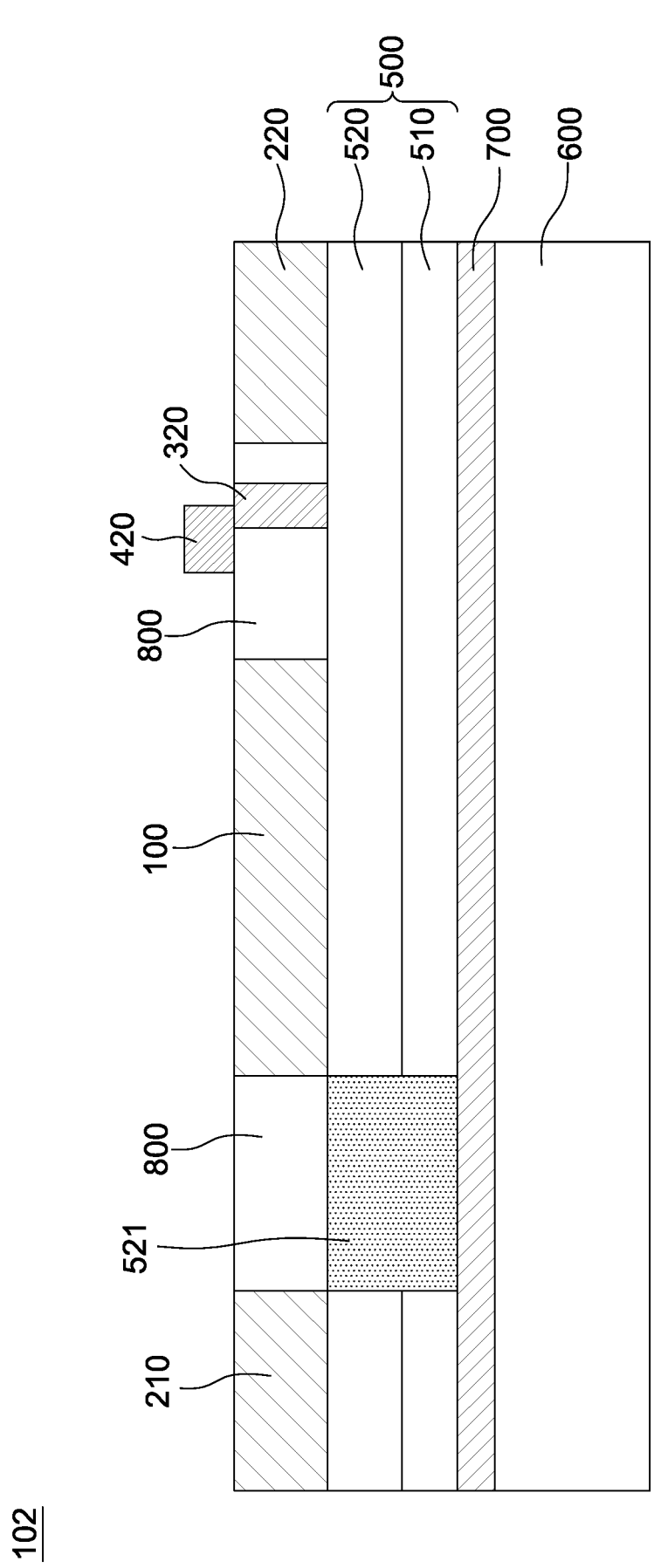
FIG. 2B is a cross-section view of the semiconductor device of FIG. 2A according to some embodiments of the present disclosure.

FIG. 2A is a top view of a semiconductor device 102 according to some embodiments of the present disclosure. FIG. 2B a cross-section view of semiconductor device 102 along line 2A-2A' of FIG. 2A. Some elements in the semiconductor device 102 are represented by the same numerals as those of the semiconductor device 101 in FIG. 1, and are made of similar materials, so detailed description thereof will not be repeated herein.

In some embodiment, the 2DEG in the III-nitride heterogeneous semiconductor stack 500 is removed to form a non-active region. The electron flow in the 2DEG will be interrupted.

The semiconductor device 102 may include non-active region 521 in the III-nitride heterogeneous semiconductor stack 500. The semiconductor device 102 may include non-active region 522 in the III-nitride heterogeneous semiconductor stack 500. At least a portion of the non-active region 521 is not overlapped by the gate electrode 310. The gate electrode 310 may not cover at least a portion of the non-active region 521. At least a portion of the non-active region 522 is not overlapped by the gate electrode 320. The gate electrode 320 may not cover at least a portion of the non-active region 522.

Non-active regions 521, 522 may be provided in the nitride layer 510. The non-active regions 521, 522 may be provided in the nitride layer 520. The non-active regions 521, 522 may be provided in both nitride layer 510 and nitride layer 520, as shown in FIG. 2B. In some embodiment, the non-active regions 521, 522 may be provided in either nitride layer 510 or nitride layer 520. The non-active regions 521 may be directly below the dielectric layer 800 between the source electrode 210 and the drain electrode 100. The non-active regions 522 may be directly below the dielectric layer 800 between the source electrode 220 and the drain electrode 100.

At least portion of the non-active region 521 may include a doped nitride semiconductor material with a dopant including $He^+$, $N^+$, $O^+$, $Fe^+$, $Ar^+$, $Kr^+$, or a combination thereof, a doped group III-V layer, an n-type polysilicon layer, a dielectric material, or a combination thereof. In some embodiment, at least a portion of the nitride layer 520 in the non-active region 521 is doped with $He^+$, $N^+$, $O^+$, $Fe^+$, $Ar^+$, $Kr^+$, or a combination thereof.

At least portion of the non-active region 522 may include a doped nitride semiconductor material with a dopant including $He^+$, $N^+$, $O^+$, $Fe^+$, $Ar^+$, $Kr^+$, or a combination thereof, a doped group III-V layer, an n-type polysilicon layer, a dielectric material, or a combination thereof. In some embodiment, at least a portion of the nitride layer 520 in the non-active region 522 is doped with $He^+$, $N^+$, $O^+$, $Fe^+$, $Ar^+$, $Kr^+$, or a combination thereof.

The non-active region 521 can remove partial 2DEG area between the source electrode 210 and drain electrode 100. The non-active region 522 can remove partial 2DEG area between the source electrode 220 and drain electrode 100. Heat will not be reproduced in the non-active region due to interrupt of 2DEG.

Figure 3:
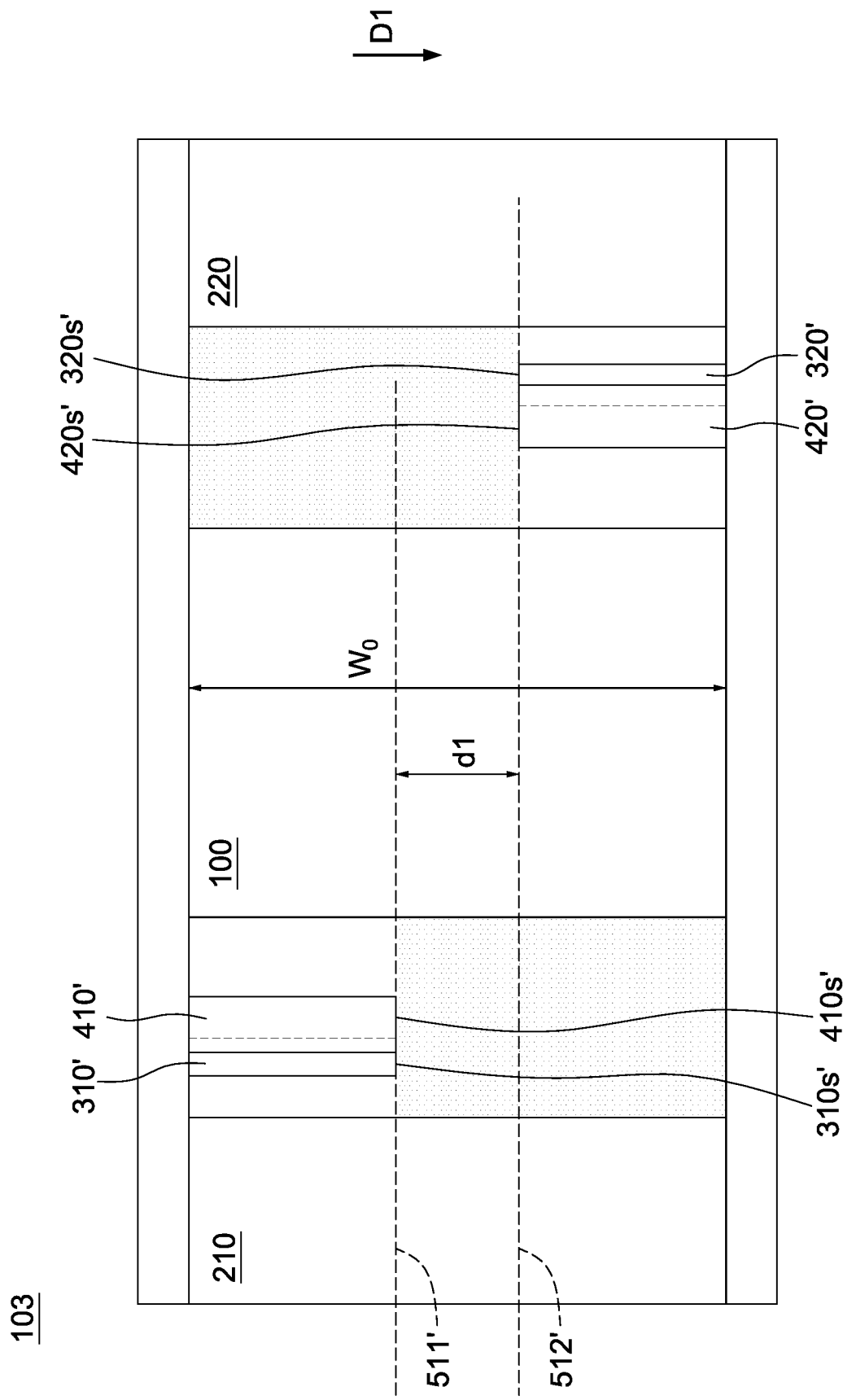
FIG. 3 is a top view of a semiconductor device according to some embodiments of the present disclosure.

FIG. 3 is a top view of semiconductor device 103. Some elements in the semiconductor device 103 are represented by the same numerals as those of the semiconductor device 101 in FIG. 1, and are made of similar materials, so detailed description thereof will not be repeated herein.

The imaginary line 511' may be arranged above the imaginary line 512' in the top view of the electronic device 103. The gate electrode 310' is arranged above the imaginary line 511' in a top view of the electronic device 103. The gate electrode 320' is arranged below the imaginary line 512' in a top view of the electronic device 103. A length of the gate electrode 310' may be less than half of the length $W_0$ of the drain electrode 100. A length of the gate electrode 320' may be less than half of the length $W_0$ of the drain electrode 100. The imaginary line 511' and the imaginary line 512' separate with a distance d1 in the direction D1 in a top view of the electronic device 103. The distance between a side 310s' of the gate electrode 310' and a side 320s' of the gate electrode 320' may be separate with a distance d1 in the direction D1 in a top view of the electronic device. The distance between a side 410s' of the field plate 410' and a side 420s' of the field plate 420' may be separate with a distance d1 in the direction D1 in a top view of the electronic device. The arrangement may cause a heat producing portion in a semiconductor device 103 reduces.

Figure 4:
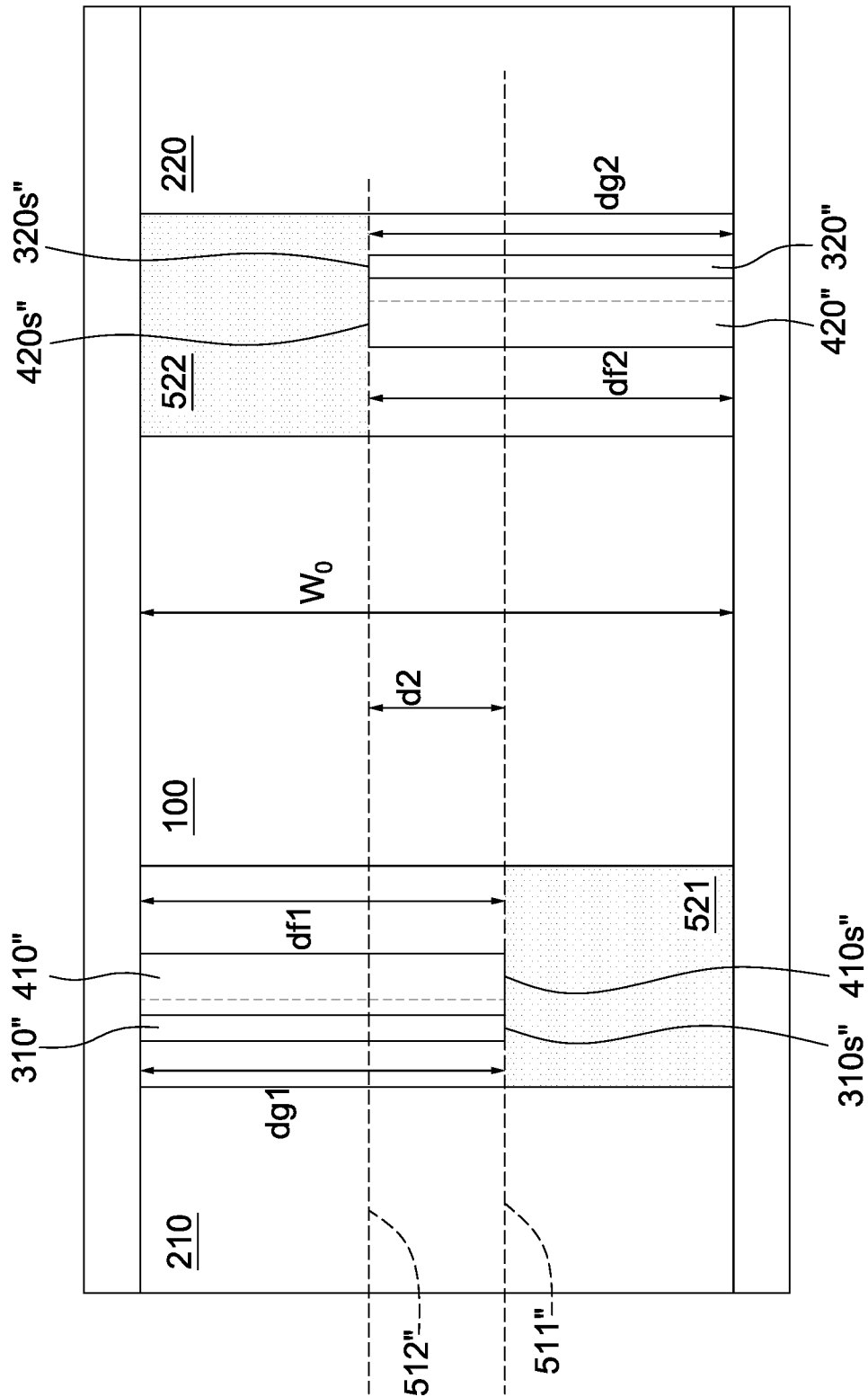
FIG. 4 is a top view of a semiconductor device according to some embodiments of the present disclosure.

FIG. 4 illustrates a top view semiconductor device 104. Some elements in the semiconductor device 104 are represented by the same numerals as those of the semiconductor device 101 in FIG. 1, and are made of similar materials, so detailed description thereof will not be repeated herein.

The imaginary line 511" is arranged below the imaginary line 512" in the top view of the electronic device 104. The gate electrode 310" is arranged above the imaginary line 511" in a top view of the electronic device 104. The gate electrode 320" is arranged below the imaginary line 512" in a top view of the electronic device. A length of the gate electrode 310" may be greater than half of the length $W_0$ of the drain electrode 100. A length of the gate electrode 320" may be greater than half of the length of the drain electrode 100 $W_0$. The imaginary line 511" and the imaginary line 512" separate with a distance d2 in the direction D1 in a top view of the electronic device 104. A gate length dg1 of the gate electrode 310" and a gate length dg2 of the gate electrode 320" may overlap with a distance d1 in the direction D1 in a top view of the electronic device. A field plate length df1 of the field plate 410" and top view a field plate length df2 of the field plate 420" may overlap with a distance d2 in the direction D1 in a top view of the electronic device. The arrangement may balance thermal management of the semiconductor device 104 and a total area of the semiconductor device 104.

Figure 5:
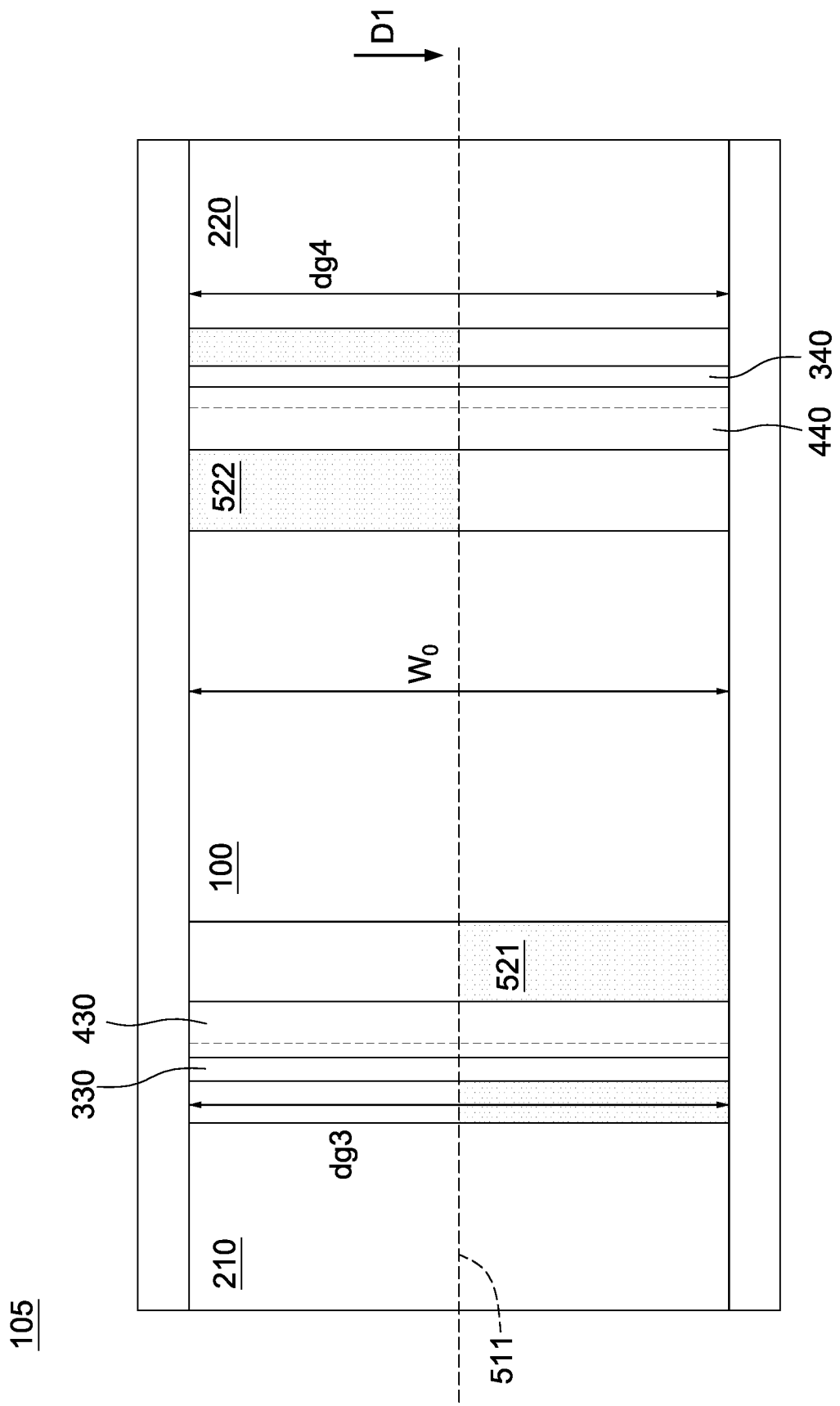
FIG. 5 is a top view of a semiconductor device according to some embodiments of the present disclosure.

FIG. 5 illustrates a top view semiconductor device 105. Some elements in the semiconductor device 105 are represented by the same numerals as those of the semiconductor device 101 in FIG. 1, and are made of similar materials, so detailed description thereof will not be repeated herein.

A gate length gd1 of gate electrode 330 may be substantially the same as a drain length $W_0$ of the drain electrode 100. A gate length gd2 of gate electrode 340 may be substantially the same as a drain length $W_0$ of the drain electrode 100.

A filed plate length gd1 of gate electrode 330 may be substantially the same as a drain length $W_0$ of the drain electrode 105. A gate length gd2 of gate electrode 340 may be substantially the same as a drain length $W_0$ of the drain electrode 105.

A length of the field plate 430 in the direction D1 may be substantially the same as a drain length $W_0$ of the drain electrode 105. A length of the field plate 440 in the direction D1 may be substantially the same as a drain length $W_0$ of the drain electrode 105.

A portion of 2DEG in the III-nitride heterogeneous semiconductor stack 500 may be removed. A non-active region 521 may be arranged below the imaginary line 511 in a top view of the semiconductor device 105. A length of the non-active region 521 in the direction D1 is shorter than a drain length $W_0$. A non-active region 522 may be arranged above the imaginary line 512 substantially perpendicular to the direction D1 in a top view of the semiconductor device 105. A length of the non-active region 522 in the direction D1 may be shorter than a drain length $W_0$. The non-active region 521 and the second non-active region 522 are asymmetrically arranged with respect to the drain electrode 100. The imaginary line 511 and the non-active region 522 may be substantially the same.

Figure 6:
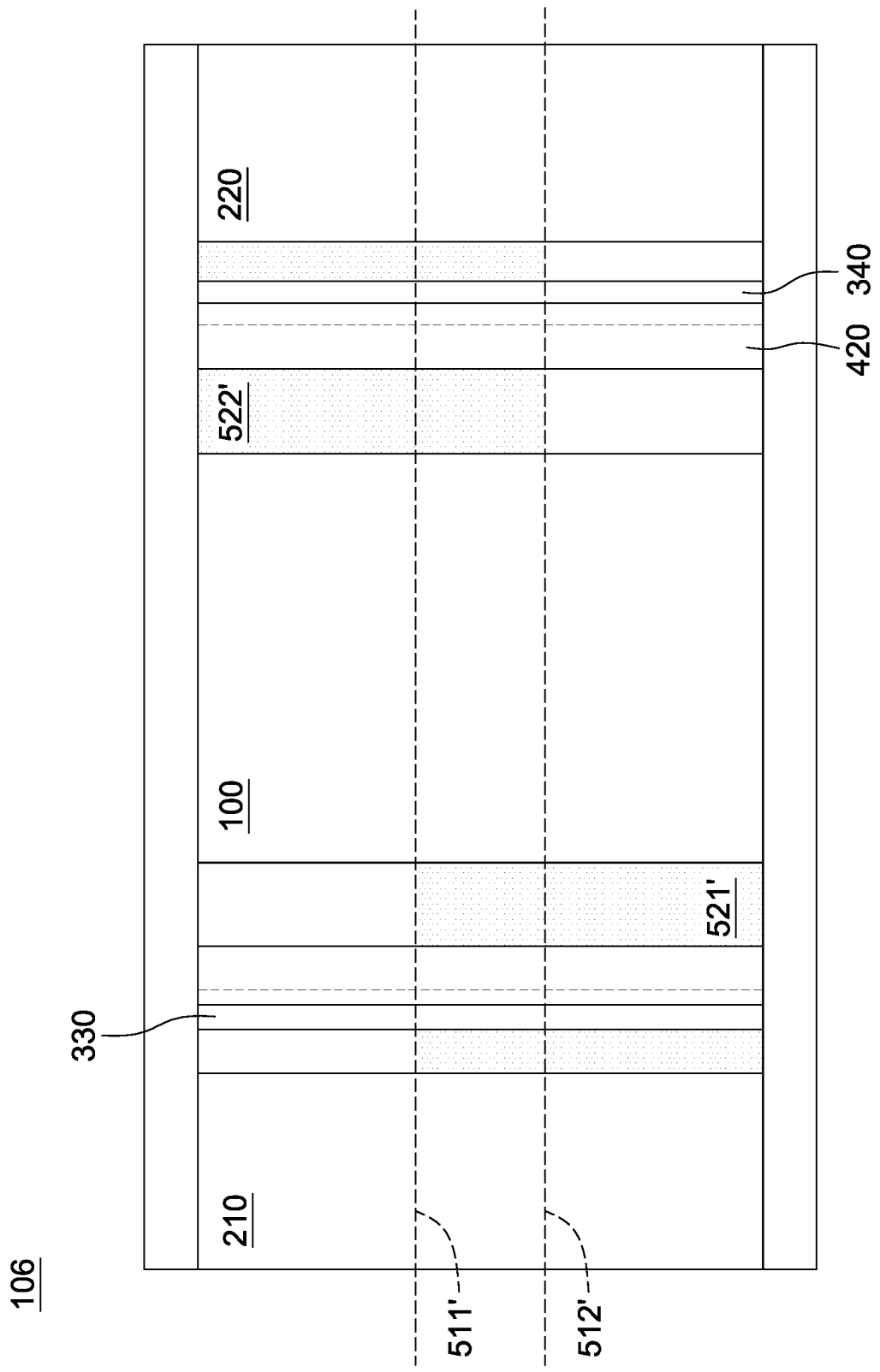
FIG. 6 is a top view of a semiconductor device according to some embodiments of the present disclosure.

FIG. 6 illustrates a top view semiconductor device 106. Some elements in the semiconductor device 106 are represented by the same numerals as those of the semiconductor device 103 in FIG. 3, and are made of similar materials, so detailed description thereof will not be repeated herein. The non-active region 512' may be arranged below the imaginary line 511' in a top view of the semiconductor device 106. The non-active region 522' may be arranged above the imaginary line 512' in the top view of the semiconductor device 106. The non-active region 521' and the non-active region 522' may be asymmetrically arranged with respect to the drain electrode 100.

Figure 7:
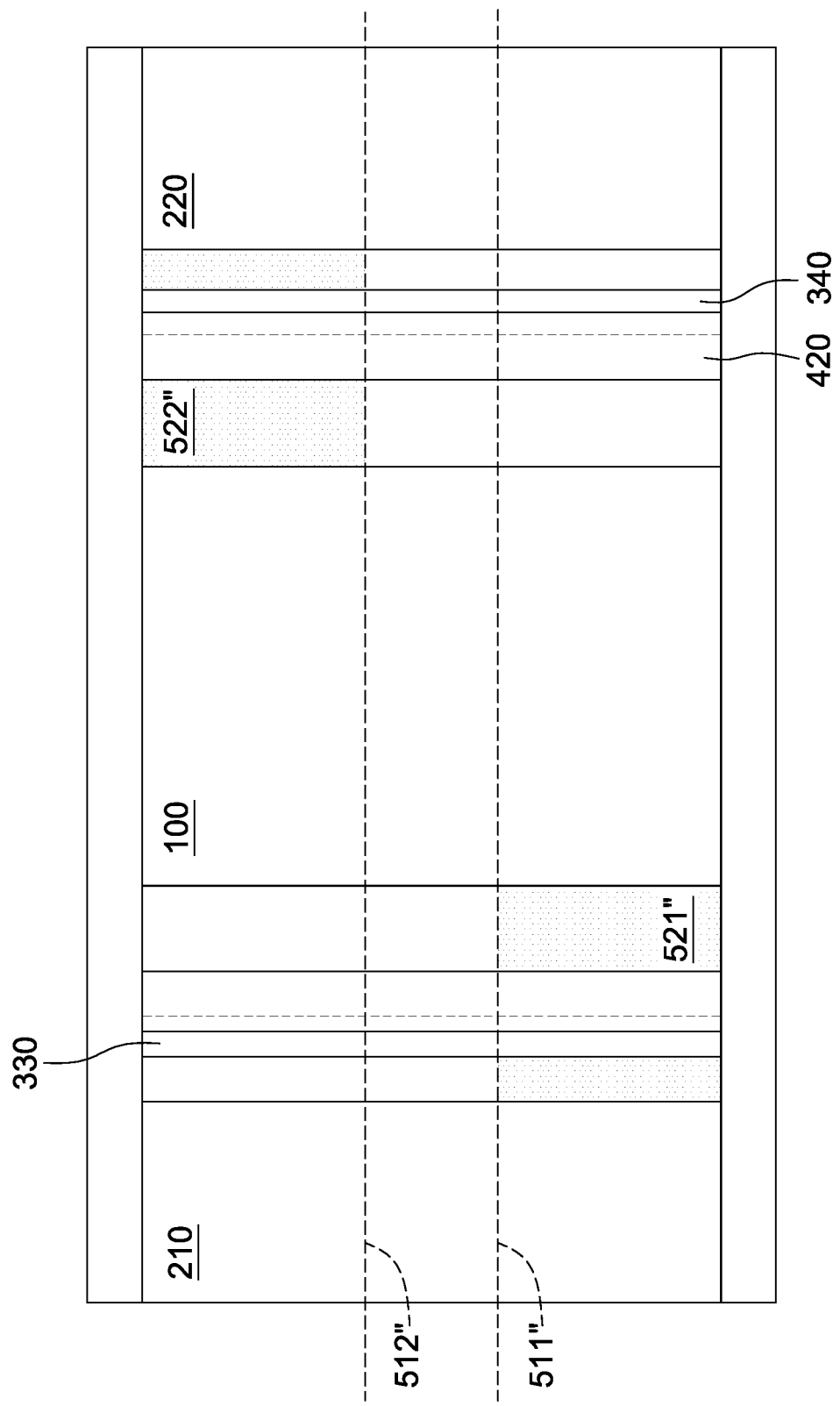
FIG. 7 is a top view of a semiconductor device according to some embodiments of the present disclosure.

FIG. 7 illustrates a top view semiconductor device 107. Some elements in the semiconductor device 107 are represented by the same numerals as those of the semiconductor device 104 in FIG. 4, and are made of similar materials, so detailed description thereof will not be repeated herein. The non-active region 521''' may be arranged below the imaginary line 511'' in a top view of the semiconductor device 107. The non-active region 522''' may be arranged above the imaginary line 512'' in the top view of the semiconductor device 107. The non-active region 521''' and the non-active region 522''' may be asymmetrically arranged with respect to the drain electrode 100.

Figure 8:
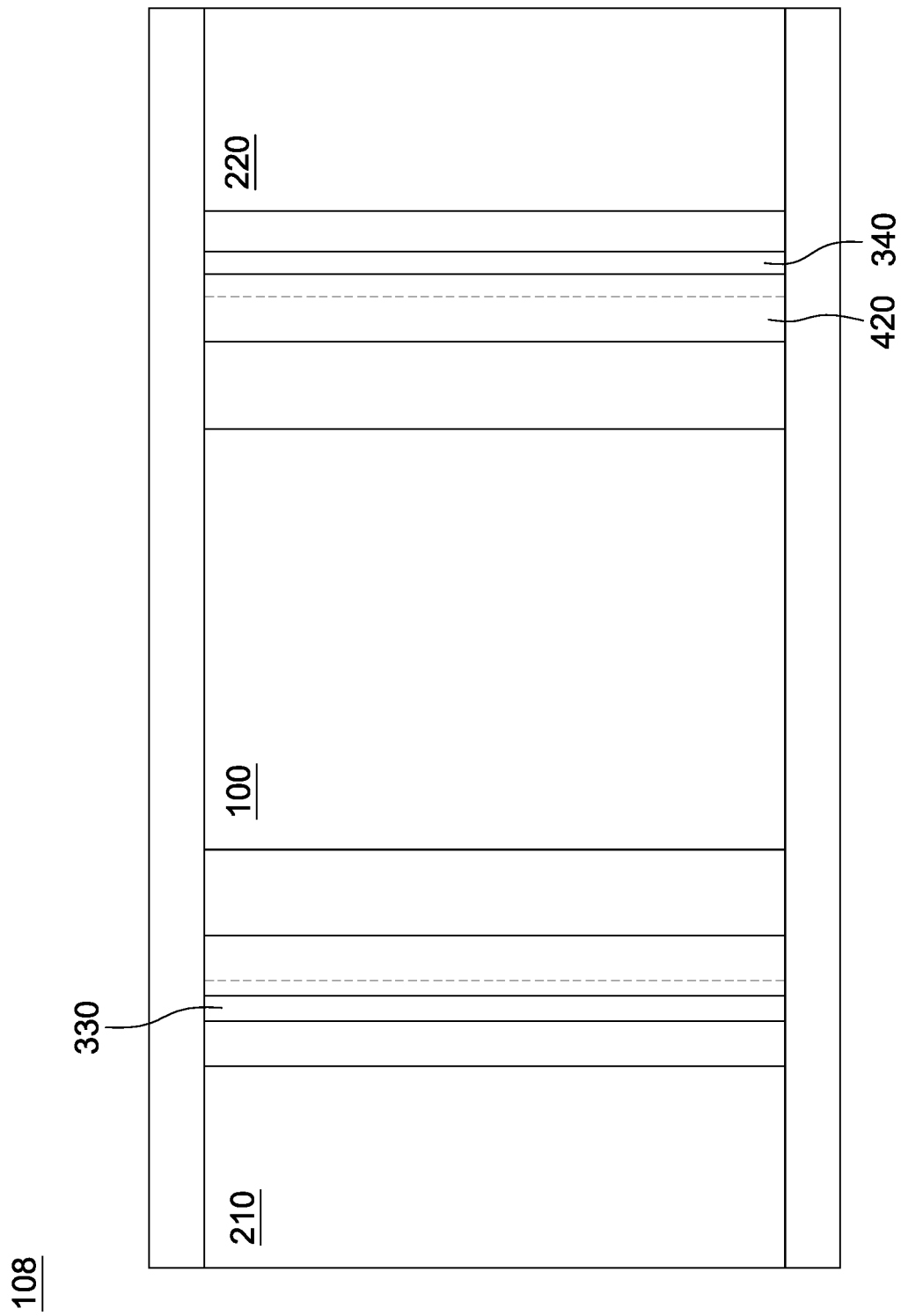
FIG. 8 is a top view of a semiconductor device according to some comparative embodiments of the present disclosure.

FIG. 8 is a cross-sectional view of a semiconductor device 108 according to another comparative embodiment. Some elements in the semiconductor device 108 are represented by the same numerals as those of the semiconductor device 105 in FIG. 1, and are made of similar materials, so detailed description thereof will not be repeated herein.

The 2DEG in the III-nitride heterogeneous semiconductor stack of the semiconductor device 108 is not removed. There is no 2DEG is removed. There is no non-active region covered by gate electrodes 330, 340. Current uninterruptedly flows in the 2DEG between source electrode 210 and drain electrode 100 under the gate electrode 310, and uninterruptedly flows in the 2DEG between source electrode 220 and drain electrode 100 under the gate electrode 320. Heat is reproduced in the whole active region. It is difficult to dissipate the heat reproduced in the active region. This will cause the performance of the semiconductor device 108 decays.

FIG. 9, FIG. 10A, FIG. 10B and FIG. 11 illustrate several operations in manufacturing a semiconductor device 10 according to some embodiments of the present disclosure.

Figure 9:
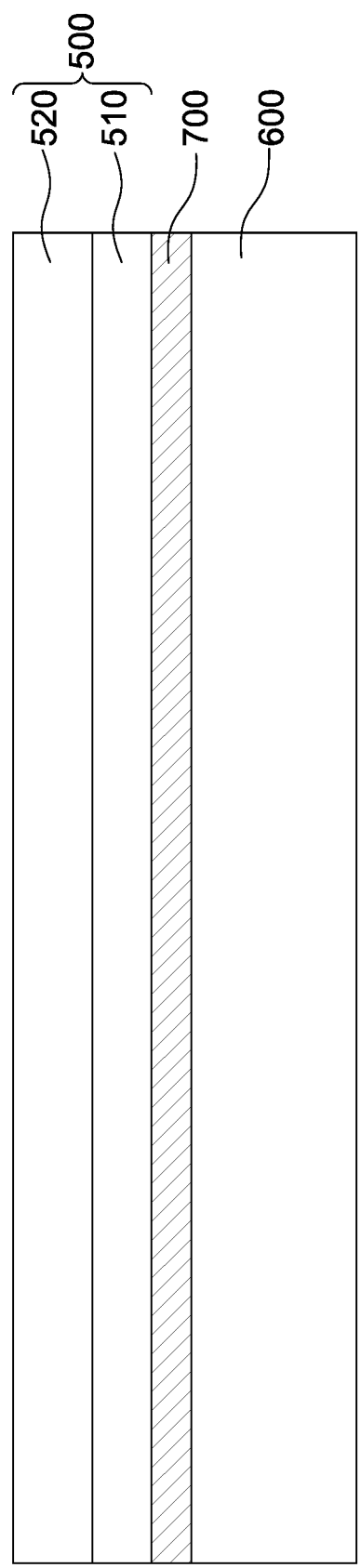

FIG. 9 shows a step of forming a III-nitride heterogeneous semiconductor stack 500 on a substrate 600. Forming the III-nitride heterogeneous semiconductor stack 500 may include the following operations: forming a nitride semiconductor layer 510 on the substrate 600, and forming a nitride layer 520 and the nitride layer 510. The nitride layer 520 may have a greater bandgap than that of the nitride layer 510 and be in direct contact with the nitride layer 510. The nitride layers 510 and 520 may be formed by epitaxial growth. As a heterojunction can be formed between the nitride layer 510 and the nitride layer 520, e.g., at an interface of the nitride layer 510 and the nitride layer 520, a 2DEG region may be formed adjacent to the interface of the nitride semiconductor layer 510 and the nitride semiconductor layer 520.

The nitride layer 510 and the nitride layer 520 may be respectively formed by any one or more modes of epitaxial growth, physical vapor deposition (PVD), chemical vapor deposition (CVD), atomic layer deposition (ALD), and the like.

In some embodiments, before the III-nitride heterogeneous semiconductor stack 500 is formed, a buffer layer 700 may be formed on the substrate 600. The buffer layer 700 may be formed by any one or more modes of epitaxial growth, physical vapor deposition (PVD), chemical vapor deposition (CVD), atomic layer deposition (ALD) and the like. The buffer layer 700 may be of a superlattice structure consisting of AlGaN and GaN.

Figure 10A:
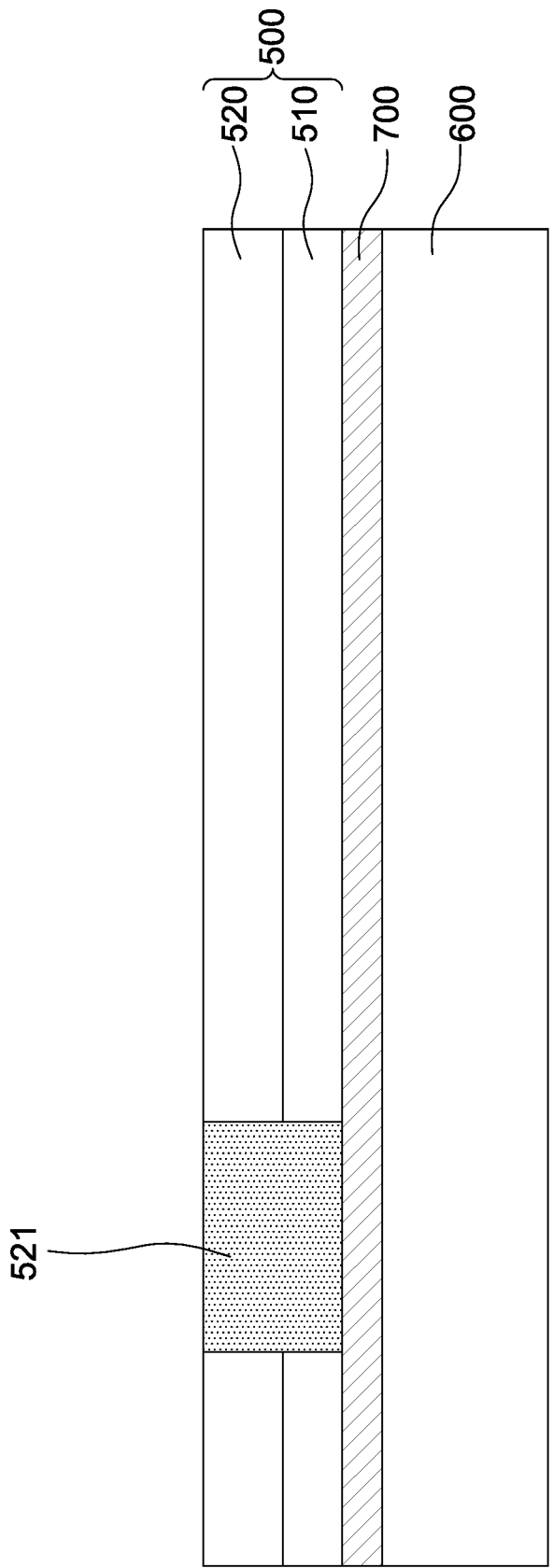
Figure 10B:
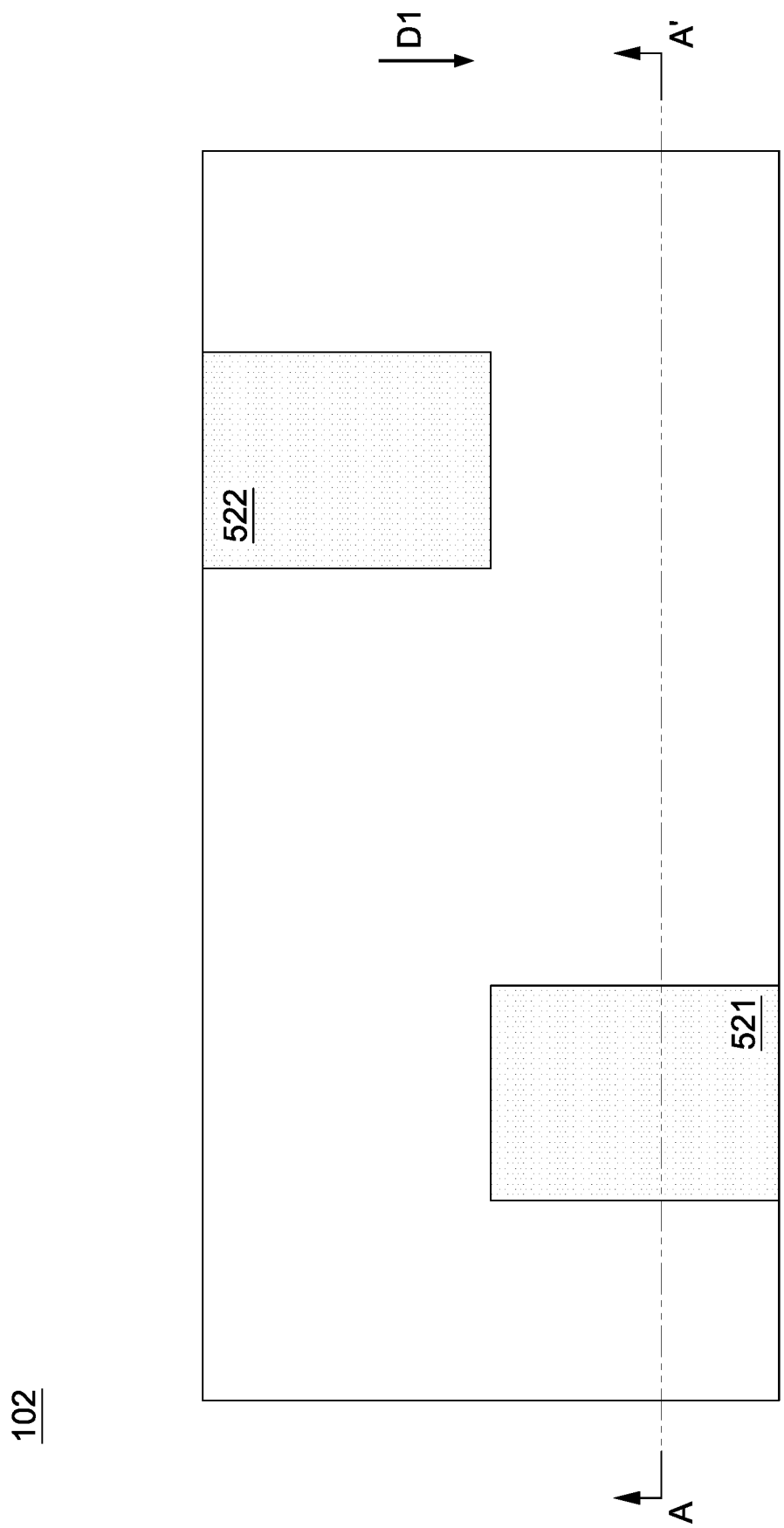

FIG. 10A may show a cross-sectional view along the cross-sectional line 10A-10A' in FIG. 10B. A non-active region 521 and a non-active region 522 may be formed in the III-nitride heterogeneous semiconductor stack 500. A material of the non-active regions 521, 522 may be different from a material of the nitride layer 510. A material of the non-active regions 521, 522 may be different from a material of the nitride layer 520. The non-active regions 521, 522 may be adjacent to the interface of the nitride layer 510 and the nitride layer 520 where a 2DEG is supposed to be formed, thus the non-active regions 521, 522 can deplete the 2DEG at the non-active regions 521, 522. Thus, no current passes the non-active regions 521, 522. The non-active regions 521, 522 may have relatively high resistance when the semiconductor device is in operation.

Forming the non-active regions 521, 522 may include performing an implantation process on a portion of the III-nitride heterogeneous semiconductor stack 500 so as to form the non-active regions 521, 522. Forming the non-active regions 521, 522 may also include the following operations: removing a portion of the III-nitride heterogeneous semiconductor stack 500 to form a recess in the III-nitride heterogeneous semiconductor stack 500, and forming a doped group III-V layer, an n-type polysilicon layer, a dielectric material, or a combination thereof in the recess, so as to form the non-active regions 521, 522.

In some embodiment, removing a portion of the III-nitride heterogeneous semiconductor stack 500 to form a recess in the III-nitride heterogeneous semiconductor stack 500 may refer to merely remove the nitride layer 510. In some embodiment, removing a portion of the III-nitride heterogeneous semiconductor stack 500 to form a recess in the III-nitride heterogeneous semiconductor stack 500 may refer to removing both the nitride layer 510 and at least partial of the nitride layer 520.

FIG. 10B shows the non-active region 521 and non-active region 522 asymmetrically arranged along a direction D1.

Figure 11A:
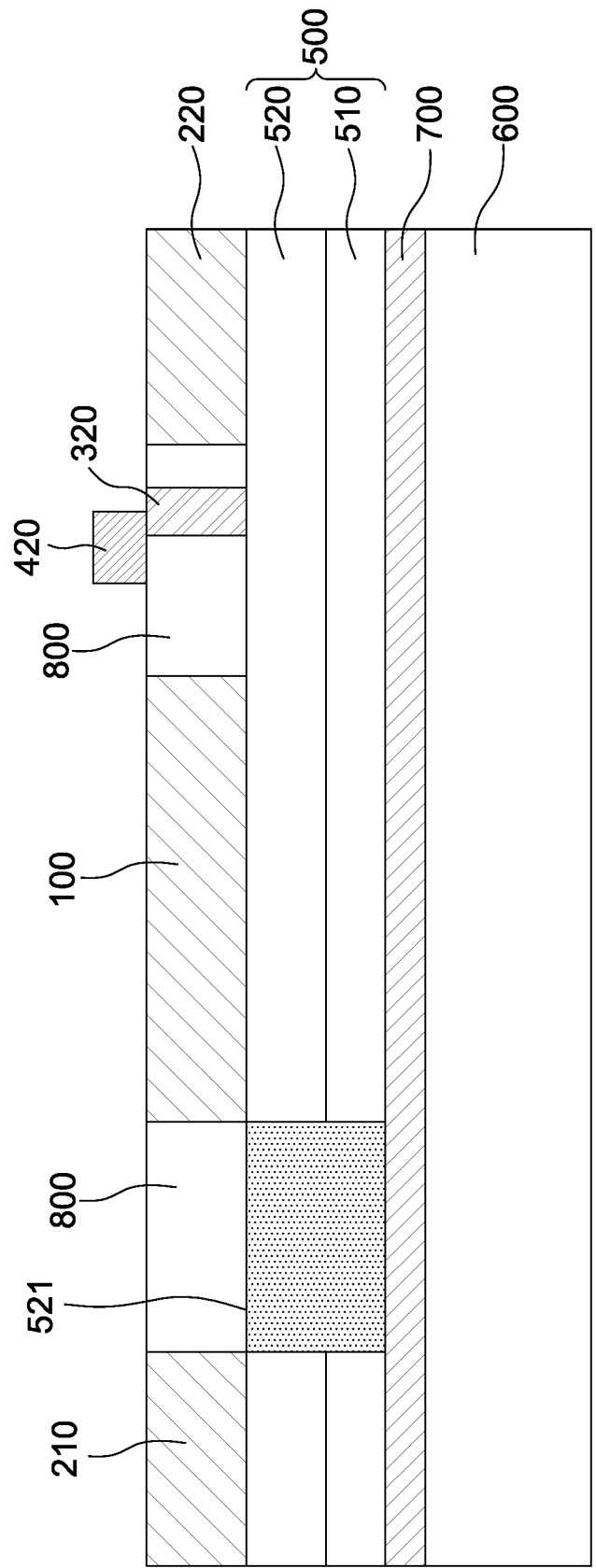

FIG. 11A may show a cross-sectional view along the cross-sectional line 11A-11A' in FIG. 11B.

FIG. 11A, source electrodes 210, 220 and a drain electrode 100 may be formed over the III-nitride heterogeneous semiconductor stack 500. The source electrodes 210, 220 and drain electrode 100 can be formed by physical vapor deposition (PVD), chemical vapor deposition (CVD), atomic layer deposition (ALD), plating, and/or other suitable deposition steps. The non-active regions 521, 522 may be formed in-situ with the formation of the source electrodes 210, 220 and drain electrode 100. In some other embodiments, the non-active regions 521, 522 may be formed after forming the source electrodes 210, 220 and drain electrode 100.

Still referring to FIG. 11, a dielectric layer may 800 may be formed between the source electrode 210 and the drain electrode 100, and between the source electrode 220 and the drain electrode 100. Field plates 410, 420 may then be formed above partial of the gate electrodes 310, 320. Field plates 410, 420 may then be formed above partial of the dielectric layer may 800. The field plates 410, 420 may be formed by, for example, depositing a conductive material and then patterning the conductive material by etching.

Referring to FIG. 11B, the non-active regions 521, 522 may be asymmetrically arranged with respect to the drain electrode 100.

As used herein, spatially relative terms, such as "beneath," "below," "lower," "above," "upper," "over," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other techniques and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device, comprising:
a drain electrode,
a first source electrode arranged on a first side of the drain electrode,
a second source electrode arranged on a second side of the drain electrode, opposite to the first source electrode,
a first gate electrode arranged between the first source electrode and the drain electrode, the first gate electrode extending along a first direction, and
a second gate electrode arranged between the second source electrode and the drain electrode, the second gate electrode extending along the first direction,
wherein the first gate electrode is arranged above a first imaginary line substantially perpendicular to the first direction in a top view of the semiconductor device and the second gate electrode is arranged below a second imaginary line substantially perpendicular to the first direction in the top view of the semiconductor device;
wherein the first source electrode, the first gate electrode, the drain electrode, the second gate electrode and the second source electrode are arranged in sequence along a second direction perpendicular to the first direction;
wherein the drain electrode comprises a drain length along the first direction, and each of a length of the first gate electrode and a length of the second gate electrode is shorter than the drain length.

2. The semiconductor device of claim 1,
wherein the first imaginary line and the second imaginary line are the same line.

3. The semiconductor device of claim 1, wherein the first imaginary line is arranged above the second imaginary line in the top view of the semiconductor device.

4. The semiconductor device of claim 1, wherein the first imaginary line is arranged below the second imaginary line in the top view of the semiconductor device.

5. The semiconductor device of claim 1, wherein the drain electrode, the first source electrode, the second source electrode, the first gate electrode and the second gate electrode are arranged on a III-nitride heterogeneous semiconductor stack including a first nitride layer and a second nitride layer having a bandgap greater than that of the first nitride layer.

6. The semiconductor device of claim 5, wherein a first non-active region in the III-nitride heterogeneous semiconductor stack is between the first source electrode and the drain electrode, and at least a portion of the first non-active region is not overlapped by the first gate electrode.

7. The semiconductor device of claim 6, further comprising a doped group III-V layer in the first non-active region.

8. The semiconductor device of claim 6, comprising an n-type polysilicon layer in the first non-active region.

9. The semiconductor device of claim 6, comprising a dielectric material in the first non-active region.

10. The semiconductor device of claim 6, wherein the first non-active region is in both of the first nitride layer and the second nitride layer.

11. The semiconductor device of claim 6, wherein a second non-active region is in the second nitride layer.

12. A semiconductor device, comprising:
a III-nitride heterogeneous semiconductor stack including a first nitride layer and a second nitride layer having a bandgap greater than that of the first nitride layer;

a drain electrode arranged on the III-nitride heterogeneous semiconductor stack having a drain length ($W_0$) along a first direction, a first source electrode arranged on a first side of the drain electrode, a second source electrode arranged on a second side of the drain electrode, opposite to the first source electrode, wherein a first non-active region is in the III-nitride heterogeneous semiconductor stack between the first source electrode and the drain electrode, and a second non-active region is in the III-nitride heterogeneous semiconductor stack between the second source electrode and the drain electrode, and wherein each of a length of the first non-active region and a length of the second non-active region is shorter than the drain length, and the first non-active region and the second non-active region are asymmetrically arranged with respect to the drain electrode;

wherein the first source electrode, the first non-active region, the drain electrode, the second non-active region and the second source electrode are arranged in sequence along a second direction perpendicular to the first direction.

13. The semiconductor device of claim 12, wherein the first non-active region is arranged below a first imaginary line substantially perpendicular to the first direction in a top view of the semiconductor device and the second non-active region is arranged above a second imaginary line substantially perpendicular to the first direction in the top view of the semiconductor device.

14. The semiconductor device of claim 13, wherein the first imaginary line and the second imaginary line are the same line.

15. The semiconductor device of claim 13, wherein the first imaginary line is arranged above the second imaginary line in the top view of the semiconductor device.

16. The semiconductor device of claim 13, wherein the first imaginary line is arranged below the t in the top view of the semiconductor device.

17. The semiconductor device of claim 12, wherein the first non-active region is not overlapped by the first gate electrode, and wherein the second non-active region is not overlapped by the second gate electrode.

18. A method for manufacturing the semiconductor device according to claim 12, comprising:

forming the III-nitride heterogeneous semiconductor stack, forming the first non-active region and the second non-active region in the III-nitride heterogeneous semiconductor layer, forming the drain electrode, the first source electrode, the second source electrode, a first gate electrode and a second gate electrode on the III-nitride heterogeneous semiconductor layer;

wherein the first non-active region and the second non-active region are asymmetrically arranged with respect to the drain electrode.

19. The method of claim 18, wherein forming the first non-active region and the second non-active region comprises:

forming two separate recesses within the III-nitride heterogeneous semiconductor stack and forming a doped group III-V layer, an n-type polysilicon layer, a dielectric material, or a combination thereof in the two separate recesses.

20. The method of claim 16, wherein providing a first non-active region and a second non-active region comprising: implanting the III-nitride heterogeneous semiconductor layer with $He^+$, $N^+$, $O^+$, $Fe^+$, $Ar^+$, $Kr^+$, or a combination thereof in the first non-active region and the second non-active region.

* * * * *